United States Patent

Richard et al.

[11] Patent Number: 5,804,968
[45] Date of Patent: Sep. 8, 1998

[54] GRADIENT COILS WITH REDUCED EDDY CURRENTS

[75] Inventors: Mark A. Richard, S. Euclid; Nicholas J. Mastandrea, Jr., Euclid; David A. Lampman, Eastlake, all of Ohio

[73] Assignee: Picker International, Inc., Highland Heights, Ohio

[21] Appl. No.: 790,936

[22] Filed: Jan. 29, 1997

[51] Int. Cl.$^6$ .................................................. G01V 3/00
[52] U.S. Cl. ............................................ 324/318; 324/322
[58] Field of Search ................................ 324/318, 322, 324/314, 307, 309; 128/653.5

[56] References Cited

U.S. PATENT DOCUMENTS

| | | | |
|---|---|---|---|
| 4,840,700 | 6/1989 | Edelstein et al. | 156/634 |
| 5,177,442 | 1/1993 | Roemer | 324/318 |
| 5,424,643 | 6/1995 | Morich et al. | 324/318 |
| 5,488,299 | 1/1996 | Kondo et al. | 324/318 |
| 5,568,051 | 10/1996 | Yamagata | 324/318 |
| 5,642,049 | 6/1997 | Harada et al. | 324/318 |

OTHER PUBLICATIONS

Serial No. 08/529,360, Issue Fee paid on Dec. 4, 1996, assigned to Assignee of present invention.

*Primary Examiner*—Louis M. Arana
*Attorney, Agent, or Firm*—Fay, Sharpe, Beall, Fagan, Minnich & McKee

[57] ABSTRACT

A magnetic resonance imaging apparatus includes a main field magnet (12) for generating a temporally constant magnetic field through an examination region. A radio frequency transmitter (84) excites and manipulates magnetic resonance in selected dipoles in the examination region. A receiver (90) demodulates magnetic resonance signals received from the examination region, a processor (74) reconstructs the demodulated resonance signals into an image representation. A plurality of fingerprint gradient magnetic field coils (24, 26) induce gradient magnetic fields across the temporally constant magnetic field. Each of the fingerprint gradient coils (24, 26) includes a generally spiral winding (32A–32D) having a first crossectional dimension (H) perpendicular to the temporally constant magnetic field which is at least twice a second crossectional dimension (W) in a direction parallel to the temporally constant magnetic field.

9 Claims, 3 Drawing Sheets

GRADIENT COILS WITH REDUCED EDDY CURRENTS

BACKGROUND OF THE INVENTION

The present invention relates to the magnetic resonance arts. It finds particular application in conjunction with medical magnetic resonance imaging systems and will be described with particular reference thereto. It is to be appreciated, however, that the invention will also find application in conjunction with other types of magnetic resonance imaging systems, magnetic resonance spectroscopy systems, and the like.

In magnetic resonance imaging applications, a 3-axis gradient coil set is used to provide spatial encoding of an NMR signal. Traditionally, X and Y-axis gradient coils are etched or machined from 1–2 mm thick copper sheet. These gradient coils are generally spiral in pattern, and are often referred to as "fingerprint" coils. The width of the individual windings that form the coils can vary, but is typically made to be as wide as possible so as to reduce the total resistance of the coil, thereby reducing thermal problems. Unfortunately, the wide windings support intra-coil eddy currents which cause ghosting and other artifact problems.

U.S. Pat. No. 5,177,422 of Roemer and U.S. Pat. No. 4,480,700 of Edelstein describe gradient coils for use in magnetic resonance imaging applications. In particular, Roemer describes how the fingerprint pattern is mathematically generated. In their patents, Roemer and Edelstein specify a constant width of conductor material to be removed, thus generating the coil pattern.

The disadvantage of the gradient sheet coils disclosed by Edelstein or Roemer is that no attempt is made to control internal or intra-coil eddy currents. Thus, using their methods, the eddy currents are reduced by reducing the total thickness of the copper. Although this is somewhat effective, a reduction in copper thickness causes a corresponding linear increase in the resistance of the coil. With modern day high current/high duty cycle scans, thin copper sheet coils generate an unacceptable amount of heat.

U.S. Pat. No. 5,424,643 of Morich, Patrick and DeMeester describe gradient sheet coils which minimize intra-coil eddy currents and heating by varying the width of the cut lines. In areas where the turns are bunched together, narrow cut lines are used to maximize the conductor widths. In other areas, two cut lines are used so that the turns are no wider than a specified maximum width. The islands defined by the two cut lines are then either segmented or removed to reduce eddy currents. Morich, Patrick and DeMeester are advantageous over Edelstein and Roemer in that heating is reduced in the high current density areas, heating is made more uniform in the low current density areas, and the power loss of the coil is reduced. Although successful in reducing eddy currents, the Morich, Patrick and DeMeester method does not eliminate intra-coil eddy currents completely.

Thus, the present invention contemplates a new and improved magnetic resonance apparatus which overcomes the above-referenced disadvantages and others.

SUMMARY OF THE INVENTION

In accordance with one aspect of the present invention, there is provided a magnetic resonance imaging apparatus including a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a plurality of fingerprint gradient magnetic field coils for inducing gradient magnetic fields across the temporally constant magnetic field. Each of the fingerprint gradient coils includes a generally spiral winding having a first crossectional dimension perpendicular to the temporally constant magnetic field which is at least twice a second crossectional dimension in a first crossectional dimension direction parallel to the temporally constant magnetic field.

In accordance with a second aspect of the present invention, there is provided a gradient coil assembly for a magnetic resonance imaging apparatus. The gradient coil includes a cylindrical former defining a bore therein with a central axis parallel to a temporally constant magnetic field of the magnetic resonance imaging apparatus, a number of gradient coils mounted on the cylindrical former wherein each gradient coil is formed from at least one electrical conductor winding spiraling in a fingerprint-like pattern on the cylindrical former, and the electrical conductor winding has a sectional profile with a height dimension in a radial direction relative to the central axis at least twice a width dimension in a direction tangential to the central axis.

In accordance with a third aspect of the present invention, there is provided a method of magnetic resonance imaging including the steps of generating a temporally constant magnetic field through an examination region in a bore of a magnetic resonance imaging apparatus, exciting and manipulating magnetic resonance in selected dipoles in the examination region, demodulating magnetic resonance signals received from the examination region, reconstructing the demodulated resonance signals into an image, and inducing gradient magnetic fields across the temporally constant magnetic field with a plurality of fingerprint gradient magnetic field coils formed from an electrical conductor winding having a sectional profile with a height dimension in a radial direction relative to a central axis of the bore at least twice a width dimension in a direction tangential to the central axis of the bore.

In accordance with a fourth aspect of the present invention, a gradient coil assembly for a magnetic resonance imaging apparatus includes a cylindrical former defining a bore therein with a central axis parallel to a temporally constant magnetic field of the magnetic resonance imaging apparatus. A plurality of gradient coils are mounted on the cylindrical former with each gradient coil being formed from a plurality of electrical conductor strands laminated together to form a fingerprint-like pattern on the cylindrical former. The electrical conductor strands each have a sectional profile with a height dimension in a radial direction relative to the central axis greater than or equal to a width dimension in a direction tangential to the central axis.

One advantage of the present invention is that it reduces intra-coil eddy currents in insert gradient coils.

Another advantage of the present invention is that it minimizes the interception of flux lines from a gradient field.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangement of steps. The drawings are only for purposes of illustrating a preferred embodiment and are not to be construed as limiting the invention.

DETAILED DESCRIPTION OF THE PREFERRED EMBODIMENTS

Figure 1:
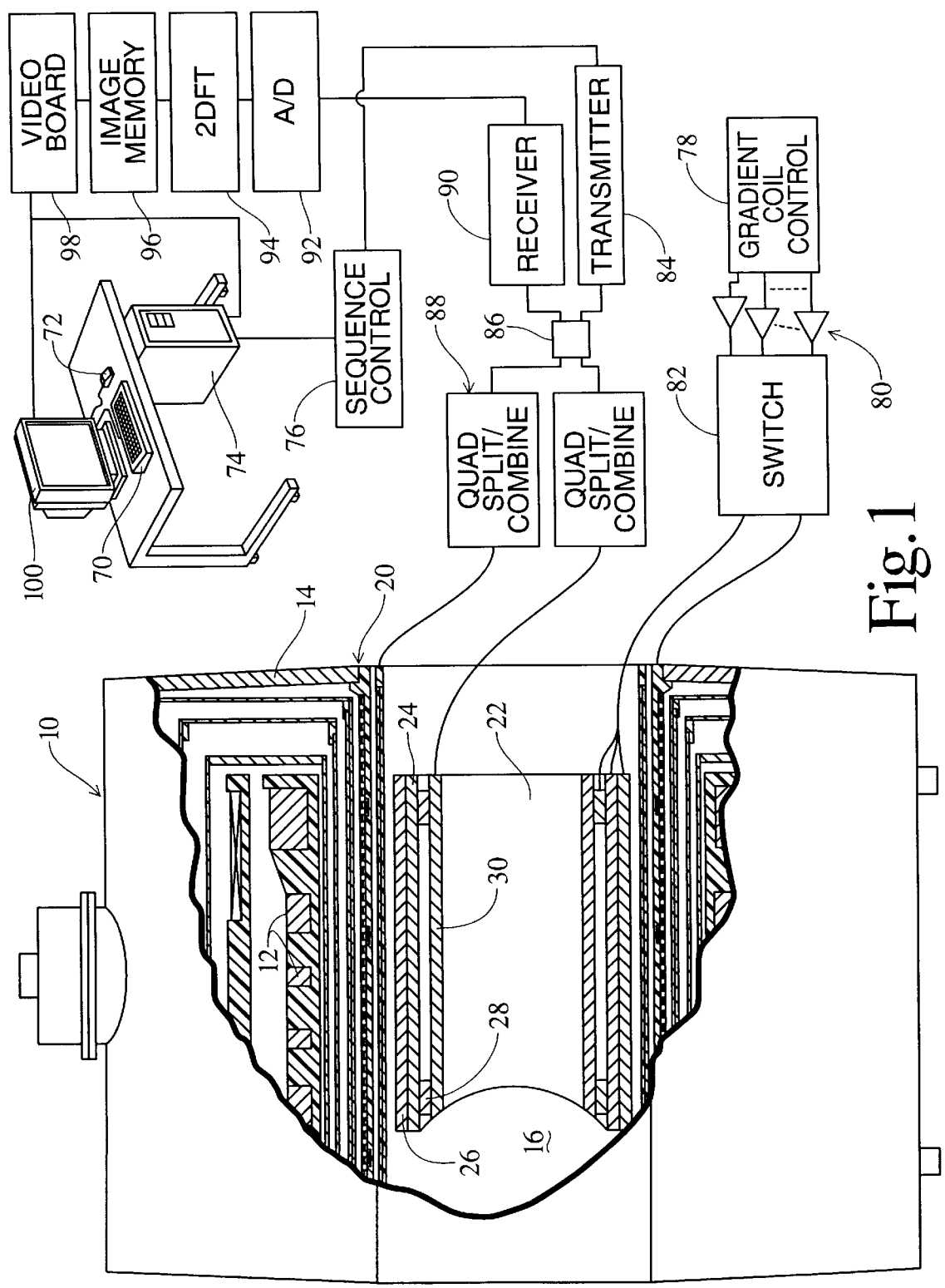
FIG. 1 is a diagrammatic illustration of a magnetic resonance imaging system in accordance with the present invention.

With reference to FIG. 1, a magnet assembly 10 generates a temporally constant magnetic field through an examination region. In the preferred embodiment, the magnet 10 is superconducting and has toroidal coils 12 disposed in a vacuum dewar 14. The examination region is defined in a central patient receiving bore 16 of the vacuum dewar 14. A circularly-cylindrical, whole-body gradient and radio frequency (RF) coil assembly 20 extends peripherally around the patient receiving bore 16.

An insertable gradient and radio frequency (RF) coil assembly 22 is received within the bore 16. The insert gradient coil assembly 22 includes a cylindrical former having an X-gradient coil 24, Y-gradient coil 26, Z-gradient coil 28, and RF coil 30 mounted thereto. The former is formed into the shape of a cylinder from a dielectric material, such as epoxy. When inserted in the patient receiving bore 16, a central or longitudinal axis of the cylindrical former is parallel with a central axis of the patient receiving bore 16.

Figure 2:
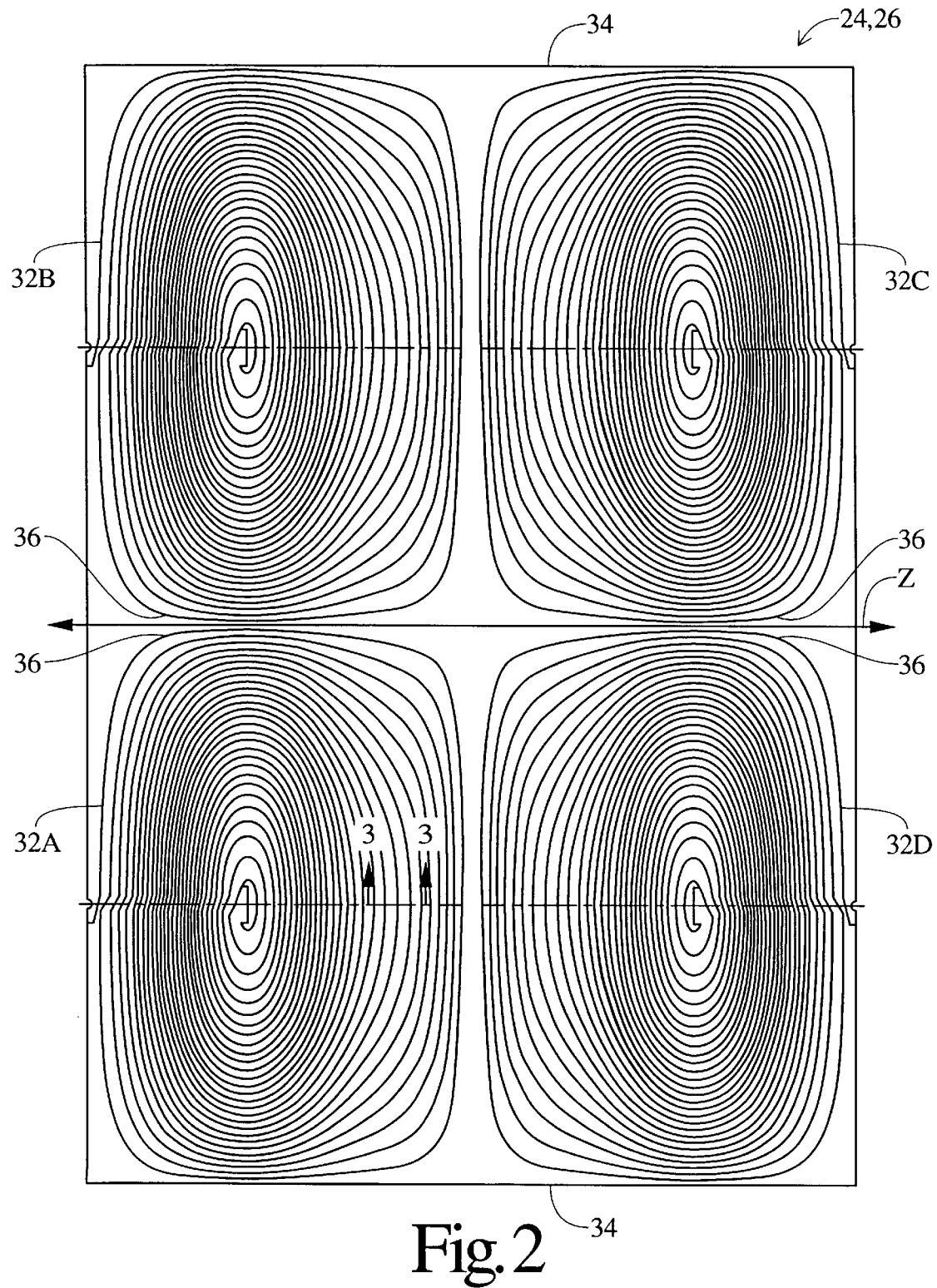
FIG. 2 is a diagrammatic illustration of an exemplary X or Y-gradient coil laid out flat.

With reference to FIG. 2, the X and Y-gradient coils 24, 26 each include four (4) electric conductor quadrant windings 32A–32D having a fingerprint pattern as shown in FIG. 2.

The X and Y-gradient coils 24, 26 are substantially equivalent to each other, but one of the gradient coils 24, 26 is circumferentially offset from the other gradient coil by approximately 90° relative to the central axis of the former. That is, the four quadrant winding construction of one of the gradient coils, (e.g. the X-gradient coil 24), is mounted around an RF shield (not shown) and the Z-gradient coil 28 so that the edges 34 thereof are positioned adjacent to each other around the former. For the X-gradient coil, the abutting edges 34 and abutting edges 36 lie in a vertical plane, i.e., the (Y,Z) plane. The resulting assembly is potted in epoxy or other dielectric material.

The four quadrant winding construction of the other gradient coil, (e.g. the Y-gradient coil 26), is then mounted around the X-gradient coil 24 so that (1) the edges 34 thereof are positioned adjacent each other, and (2) the Y-gradient coil 26 is circumferentially offset from the X-gradient coil 24 by 90°. For the Y-gradient coil, the edges 34 and 36 lie in a horizontal plane, i.e., the (X, Z) plane. The resulting assembly is potted in epoxy or other dielectric material.

Figure 3:
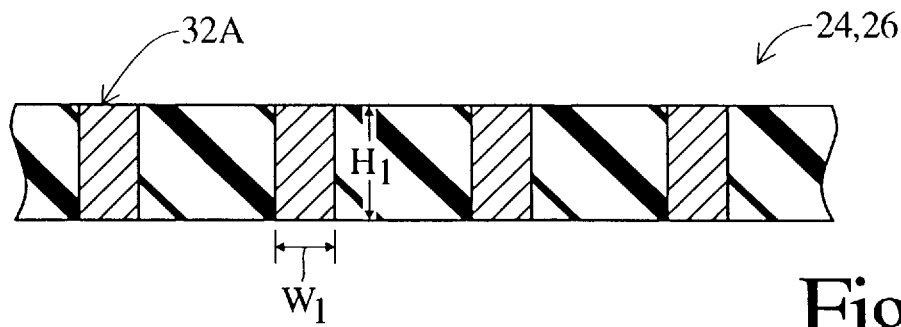
FIG. 3 is a sectional view through a first embodiment of the X or Y-gradient coil taken along the line 3—3 of FIG. 2.

With reference to FIG. 3, the X and Y-gradient coils 24, 26 are constructed with electrical conductor windings 32A–32D each having a cross-sectional profile which is substantially higher than it is wide. More particularly, the electrical conductor windings 32A–32D have a cross-sectional profile wherein the height ($H_1$) of the electrical conductor windings 32A–32D is at least twice as great as the width ($W_1$) of the electrical conductor windings 32A–32D, i.e. the electrical conductor windings 32A–32D satisfy:

$$H_x \geq 2W_x \qquad (1).$$

In the embodiment being described, the electrical conductor windings 32A–32D have a width ($W_1$) in the range of about 2.5–3.5 mm, and preferably about 3.0 mm. Depending upon the desired coil resistance and current, the electrical conductor windings 32A–32D have a height ($H_1$) in the range of about 5.5–6.5 mm, and preferably about 6.0 mm.

The electrical conductor windings 32A–32D are oriented such that the height ($H_1$) dimension of the windings 32A–32D extends radially outwardly from the central axis of the former (and the central Z axis of the bore 16 when the insertable gradient and RF coil assembly 22 is positioned in the bore 16). Thus, the height ($H_1$) of the electrical conductor windings 32A–32D is oriented in a direction radially outwardly from the central axis of the former. The width ($W_1$) of the electrical conductor windings 32A–32D is oriented in a direction tangential to the central axis of the former.

It should be appreciated that intra-coil eddy currents are inherently non-uniform in space because gradient sheet coils typically do not have symmetrical windings (i.e., windings at the center of the thumb print tend to bunched together while the outer windings are spaced apart). Eddy currents which are spatially dependent cause a significant problem for NMR imaging applications because eddy current compensation can only be performed at one point in space. The problem is compounded when a small diameter insert gradient coil is employed. In such cases, the imaging volume is much closer to the gradient sheet coils. Thus, the effects of the intra-coil eddy currents are much more apparent.

The intra-coil eddy current problem is compounded by the use of wider copper electrical conductor windings which more readily support intra-coil eddy currents than narrow copper windings. The eddy current loops are primarily induced in planes tangential to the surface of the cylindrical former. However, wider electrical conductor windings advantageously provide reduced heat generation during high current/high duty cycle scans.

Narrowing the width ($W_1$) of the electrical conductor windings 32A–32D reduces the interception of flux lines from the gradient field and the windings inherent ability to support eddy currents, thereby reducing the intensity of the induced intra-winding eddy currents. Increasing the height ($H_1$) of the electrical conductor windings 32A–32D reduces the resistance of the electrical conductor windings 32A–32D thus reducing the amount of heat generated during high current/high duty cycle scans.

The electrical conductor windings 32A–32D are formed by cutting or machining away conductor material from 6.0 mm or thicker copper plating to form the windings 32A–32D. The electrical conductor windings 32A–32D can also be formed by milling, etching, punching, abrasive water jet cutting, etc. of copper plating. The fingerprint pattern can also be formed by bending copper strips, filling a pattern, building up multiple layers, wrapping solid or stranded wire about a form, or the like.

Figure 4:
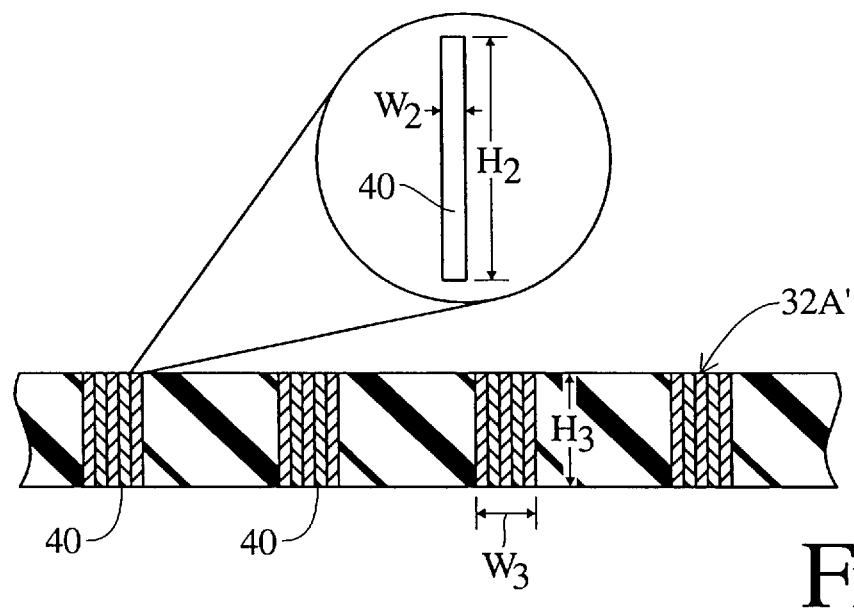
FIG. 4 is a sectional view through a second embodiment of the X or Y-gradient coil taken along the line 3—3 in FIG. 2.

Referring now to FIG. 4, electrical conductor windings 32A'–32D' are formed by vertically laminating together several radially oriented layers of conductive material 40. Each layer of conductive material 40 satisfies equation (1) above (e.g. $H_x \geq 2W_x$). The height ($H_2$) of each laminate or layer of conductive material 40 is in the range of about 5.5–6.5 mm, and preferably about 6.0 mm. The width ($W_2$) of each layer 40 is in the range of about 2.5–3.5 mm, and preferably about 3.0 mm.

The ratio of height ($H_3$) to width ($W_3$) of the resulting laminated conductor windings 32A'–32D' is not critical. That is, the height ($H_3$) and width ($W_3$) of the resulting laminated conductor windings 32A'–32D' does not have to satisfy equation (1) above. The resulting laminated conductor windings 32A'–32D' may have a cross-sectional profile wherein the height ($H_3$) of the resulting laminated conductor windings is less that the width ($W_3$) of the resulting laminated conductor windings, i.e. the resulting laminated conductor windings satisfy:

$$H_x < W_x \qquad (2).$$

The laminated conductor windings 32A'–32D' are formed by insulating adjacent layers or strips of thin conductive material (e.g. copper foil) from each other so that current flow between each of the conductive layers 40 forming the laminated conductor windings 32A'–32D' is minimized. The conductive layers 40 are joined together at each end of the respective laminated conductor windings 32A'–32D' to allow gradient current to flow through all of the conductive layers forming the laminated conductor windings 32A'–32D'.

For a given conductor profile (W to H ratio), the decrease in intra-coil eddy current levels over the non-laminated electrical conductor windings 32A–32D is proportional to the thickness and to the number of laminate layers 40 forming the conductor windings 32A'–32D'. The electrical conductor windings 32A'–32D' are oriented so that the windings 32A'–32D' extend radially outwardly from a central longitudinal axis of the bore 16.

That is, the height ($H_2$) of the layers 40 forming the electrical conductor windings 32A'–32D' is oriented in a direction radially outwardly from the central axis of the former (and the central Z axis of the bore 16 when the insertable gradient and RF coil assembly 22 is positioned in the bore 16). The width ($W_2$) of the layers 40 forming the electrical conductor windings 32A'–32D' is oriented in a direction tangential to the central axis of the former.

Figure 5:
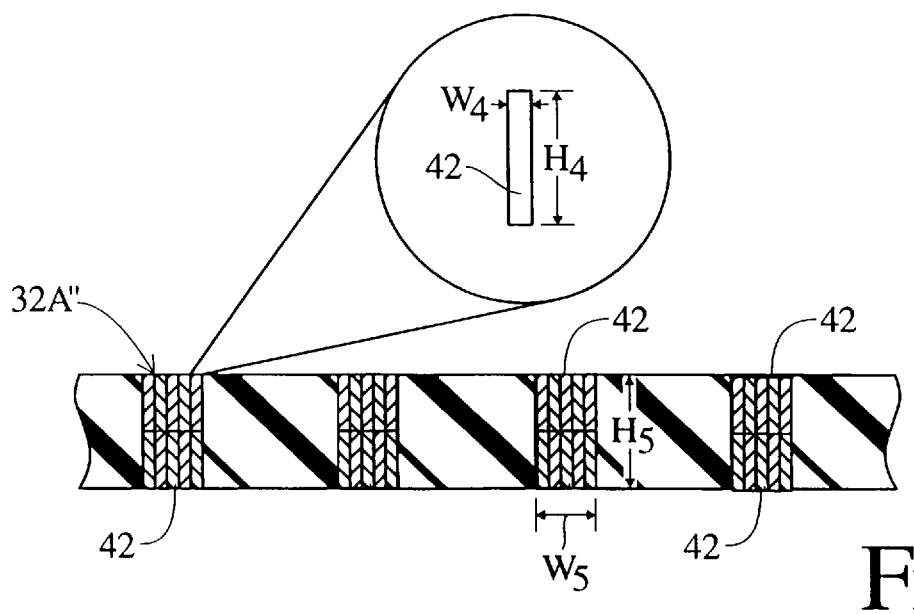
FIG. 5 is a sectional view through a third embodiment of the X or Y-gradient coil taken along the line 3—3 in FIG. 2.

Referring now to FIG. 5, electrical conductor windings 32A"–32D" are formed by vertically and horizontally laminating together several radially oriented layers or strands of conductive material 42. Each strand of conductive material 42 has a height ($H_4$) which is greater than or equal to a width ($W_4$), i.e. each strand of conductive material 42 satisfies:

$$H_x \geq W_x \qquad (3).$$

The ratio of height ($H_5$) to width ($W_5$) of the resulting laminated conductor windings 32A"–32D" is not critical. That is, the resulting laminated conductor windings 32A"–32D" may have a cross-sectional profile wherein the height ($H_5$) is less that the width ($W_5$) in accordance with equation (2).

The laminated conductor windings 32A"–32D" are formed by insulating adjacent strands of conductive material 42 (e.g. copper foil) from each other so that current flow between each of the conductive strands 42 forming the laminated conductor windings 32A"–32D" is minimized. The conductive strands 42 are joined together at each end of the respective laminated conductor windings 32A"–32D" to allow gradient current to flow through all of the conductive strands forming the laminated conductor windings 32A"–32D".

The electrical conductor windings 32A"–32D" are oriented so that the windings 32A"–32D" extend radially outwardly from a central longitudinal axis of the bore 16. That is, the height ($H_4$) of the strands 42 forming the electrical conductor windings 32A"–32D" is oriented in a direction radially outwardly from the central axis of the former (and the central Z axis of the bore 16 when the insertable gradient and RF coil assembly 22 is positioned in the bore 16). The width ($W_4$) of the strands 42 forming the electrical conductor windings 32A"–32D" is oriented in a direction tangential to the central axis of the former.

Thus, the electrical conductor windings 32A–32D, 32A'–32D' and 32A"–32D" are provided with a sectional profile which reduces electrical conductor winding resistance. It should be appreciated that electrical conductor winding resistance disadvantageously facilitates the generation of $I^2R$ heat.

The sectional profile of the electrical conductor windings 32A–32D, 32A'–32D', 32A"–32D" also reduces the generation of deleterious intra-coil eddy currents which are responsible for undesirable imaging performance characteristics such as low slew rates. The reduction of intra-coil eddy currents is attributable to providing a conductor profile which is about 3.0 mm in width (W), and to providing an enlarged gap between adjacent electrical conductor windings 32A–32D, 32A'–32D'. The reduction of intra-coil eddy currents is also attributable to providing an electrical conductor comprising a number of layers or strands of conductive material which are laminated together so as to orient a height (H) dimension in a radial direction.

With reference again to FIG. 1, in operation, an operator using a keyboard 70 and/or a pointing device 72, such as a mouse, controls a workstation computer 74. The computer 74 controls a magnetic resonance sequence controller 76 which controls the implementation of a selected one of a multiplicity of magnetic resonance imaging sequences. The sequence controller 76 causes a gradient coil control 78 to control an array of gradient or current amplifiers 80. The amplifiers 80 supply appropriate current pulses to either the X, Y, and Z-gradient coils 24–28 of the insertable gradient and RF coil assembly 22 or to the gradient coils of the whole-body gradient and RF coil assembly 20. A switch 82 selectively disconnects the current amplifiers 80 from the whole-body gradient and RF coil assembly 20 when the insertable gradient and RF coil assembly 22 is inserted into the bore 16. The X, Y, and Z-gradient coils 24–28 of the insert gradient coil assembly 22 or the whole body gradient coil assembly 20 generate magnetic field gradient pulses of the selected magnetic resonance sequence in response to current pulses received from the amplifiers 80.

A digital transmitter 84 generates radio frequency pulses under the control of the sequence controller 76 to cause either the RF coil associated with the whole-body gradient and RF coil assembly 20, or the RF coil 30 associated with the insertable gradient and RF coil assembly 22 to emit radio frequency magnetic resonance excitation and manipulation signals. In particular, the transmitter 84 generates radio frequency signals which are conveyed by a switch 86 through a quadrature splitter/combiner 88 to one of (1) the RF coil associated with the whole-body gradient and RF coil assembly 20 and (2) the insert RF coil 30. The switch 86 also connects the selected one of the RF coils with a receiver 90 to supply received magnetic resonance signals thereto.

The receiver 90, preferably a digital receiver, demodulates the magnetic resonance signals emanating from the examination region. An analog-to-digital (A/D) converter 92 generates digital, raw, complex magnetic resonance signals.

An array processor (2DFT) 94 performs a two or three-dimensional inverse Fourier transform on the digital resonance signals, thus generating a two-dimensional complex image. The complex image has an array or grid of complex vector data values.

Each data value has a magnitude value and a phase angle value, i.e. real and imaginary components for each pixel or voxel of the field of view which is loaded into an image memory 96. An operator using the keyboard 70 and mouse 72 controls the computer 74 which causes a video board 98 to withdraw selected images, such as magnitude images, planes of image data, three dimensional renderings, create cut plane images, and the like, for human-readable display on a video monitor 100.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed:

1. A magnetic resonance imaging apparatus including a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a plurality of fingerprint gradient magnetic field coils for inducing gradient magnetic fields across the temporally constant magnetic field, each of the fingerprint gradient coils including:

a former having a cylindrical surface;

a plurality of laminations laminated together to form a resulting spiral winding, each of said plurality of laminations having a first crossectional dimension extending in a direction radially outward from and perpendicular to the cylindrical surface, which first crossectional dimension is at least twice a second crossectional dimension in a direction perpendicular to the first crossectional dimension and parallel to the cylindrical surface, such that the laminations are mounted on end on the cylindrical surface.

2. The apparatus as set forth in claim 1, wherein the first crossectional dimension is at least 6.0 mm and the second crossectional dimension is less than 3.0 mm.

3. A gradient coil assembly for a magnetic resonance imaging apparatus, the gradient coil comprising:

a cylindrical former defining a bore therein with a central axis parallel to a temporally constant magnetic field of the magnetic resonance imaging apparatus;

a plurality of gradient coils mounted on the cylindrical former, each gradient coil being formed from at least one electrical conductor winding spiraling in a fingerprint-like pattern on the cylindrical former; and the electrical conductor winding having a sectional profile with a height dimension in a radial direction relative to the central axis at least twice a width dimension in a direction perpendicular to the height dimension.

4. The gradient coil assembly as set forth of in claim 3 wherein the height dimension of the electrical conductor winding is in the range of about 5.5 mm to about 6.5 mm and the width dimension of the electrical conductor winding is in the range of about 2.5 mm to about 3.5 mm.

5. The gradient coil assembly as set forth of in claim 4 wherein the height dimension of the electrical conductor winding is about 6.0 mm and the width dimension of the electrical conductor winding is about 3.0 mm.

6. A gradient coil assembly for a magnetic resonance imaging apparatus, the gradient coil comprising:

a cylindrical former defining a bore therein with a central axis parallel to a temporally constant magnetic field of the magnetic resonance imaging apparatus;

a plurality of gradient coils mounted on the cylindrical former, each gradient coil being formed from at least one gradient coil winding spiraling in a fingerprint-like pattern on the cylindrical former; and the gradient coil winding being formed from a plurality of electrical conductor windings each having a sectional profile with a height dimension extending in a radial direction relative to the central axis that is at least twice a width dimension in a direction perpendicular to the height dimension, the plurality of electrical conductor windings each being laminated together along the height dimension to form the gradient coil winding.

7. The gradient coil assembly as set forth in claim 6 wherein the height dimension of each of the plurality of electrical conductor windings is at least 6.0 mm and the width dimension of each of the plurality of electrical conductor windings is less than 3.0 mm.

8. A method of magnetic resonance imaging, comprising:

generating a temporally constant magnetic field through an examination region in a bore of a magnetic resonance imaging apparatus;

exciting and manipulating magnetic resonance in selected dipoles in the examination region;

demodulating magnetic resonance signals received from the examination region;

reconstructing the demodulated resonance signals into an image; and inducing gradient magnetic fields across the temporally constant magnetic field with a plurality of fingerprint gradient magnetic field coils each formed by laminated electrical conductor windings each having a sectional profile with a height dimension in a radial direction relative to a central axis of the bore being at least twice a width dimension in a direction perpendicular to height dimension, the laminated electrical conductor windings being laminated together with lamination interfaces parallel to the height dimension to form each fingerprint gradient magnetic field coil.

9. A gradient coil assembly for a magnetic resonance imaging apparatus, the gradient coil comprising:

a former having a cylindrical surface defining a bore therein with a central axis parallel to a temporally constant magnetic field of the magnetic resonance imaging apparatus;

a plurality of gradient coils mounted on the cylindrical former, each gradient coil being formed from a plurality of electrical conductor strands laminated together to form a fingerprint-like pattern on the cylindrical former; and the electrical conductor strands each having a sectional profile with a height dimension in a radial direction perpendicular to the cylindrical surface greater than or equal to a width dimension in a direction perpendicular to the height dimension and parallel to a plane tangent to the cylindrical surface, the plurality of electrical conductor strands being laminated together on surfaces parallel to the height dimensions.

* * * * *